United States Patent [19]
Walther et al.

[11] Patent Number: 5,648,739
[45] Date of Patent: Jul. 15, 1997

[54] SWITCHING DEVICE HAVING A POLARITY REVERSAL PROTECTION SYSTEM

[75] Inventors: Michael Walther; Gerhard Siese, both of Ludwigsburg, Germany

[73] Assignee: Robert Bosch GmbH, Stuttgart, Germany

[21] Appl. No.: 529,480

[22] Filed: Sep. 18, 1995

[30] Foreign Application Priority Data

Sep. 16, 1994 [DE] Germany .................. 44 32 957.1

[51] Int. Cl.$^6$ .................. H02H 9/00; H03K 17/08
[52] U.S. Cl. .................. 327/330; 327/436; 307/125; 361/18; 361/58
[58] Field of Search ................. 327/309, 313, 327/314, 320, 328, 330, 427, 436, 437, 434; 361/58, 18; 307/125, 127, 130, 131, 132 E, 138

[56] References Cited

U.S. PATENT DOCUMENTS

| | | | |
|---|---|---|---|
| 4,178,619 | 12/1979 | Seiler et al. ................ | 361/91 |
| 5,027,250 | 6/1991 | Cini et al. ................. | 361/18 |
| 5,126,911 | 6/1992 | Contiero et al. ............. | 361/84 |
| 5,333,093 | 7/1994 | Krautschneider et al. ....... | 327/309 |
| 5,410,441 | 4/1995 | Allman ...................... | 361/18 |

FOREIGN PATENT DOCUMENTS

| | | | |
|---|---|---|---|
| 0 349 836 | 6/1989 | European Pat. Off. ....... | H02H 11/00 |
| 0 495 142 | 1/1991 | European Pat. Off. ....... | H02H 11/00 |
| 38 35 662 | 4/1990 | Germany .................. | B60R 16/02 |
| 93/10588 | 5/1993 | WIPO ..................... | H02H 11/00 |

*Primary Examiner*—Timothy P. Callahan
*Assistant Examiner*—Terry L. Englund
*Attorney, Agent, or Firm*—Kenyon & Kenyon

[57] ABSTRACT

A switching device has at least a first connection and a second connection, as well as a control connection. The switching device includes at least a first transistor and a second transistor. A load is connected to the second connection of the switching device, and a control unit is connected to the control connection of the switching device. A power supply is normally connected to the first connection, and the second connection is normally connected to ground via the load. The switching device further includes a polarity reversal protection system for protecting the switching device and the load from damage in case of a polarity reversal, which occurs when the power supply is connected to the second connection through the load, and the first connection is connected to ground. The second transistor is connected in series between the first connection of the switching device and the first transistor. The second transistor is operated inversely with respect to the first transistor.

4 Claims, 3 Drawing Sheets

5,648,739

SWITCHING DEVICE HAVING A POLARITY REVERSAL PROTECTION SYSTEM

BACKGROUND INFORMATION

Switching devices having a first and a second connection as well as a control connection are known. So called field effect transistors are frequently used as switching devices.

A disadvantage of these switching devices is that they do not guarantee protection against polarity reversal. If the supply voltage is installed incorrectly polarized, the case can arise in which there is a continuous current in the load. If the load is, for example, a solenoid valve, this can lead, for example, to the fact that the solenoid valve remains permanently in one position independent of the drive signal. The case can arise with other loads that the switching device and/or the load to which current is applied by the switching device, or the consumer is damaged or even destroyed.

SUMMARY OF THE INVENTION

It is the object of the present invention to provide a switching device which has a polarity reversal protection system which prevents the switching device and/or the consumer from being damaged in the case of polarity reversed connections of the supply voltage.

The switching device according to the present invention protects the consumer against polarity reversal. In the case of polarity reversal, the switching device and the consumer cannot be damaged. It is particularly advantageous that the polarity reversal protection arrangement does not require a separate earth connection. The polarity reversal protection arrangement can be jointly integrated in a three-phase housing with the field effect transistors normally used. Because of the internal polarity reversal protection system, there is thus no need for an additional connection. Furthermore, the polarity reversal protection system can be produced in the same work operation as the usual field effect transistor.

DETAILED DESCRIPTION

Figure 1:
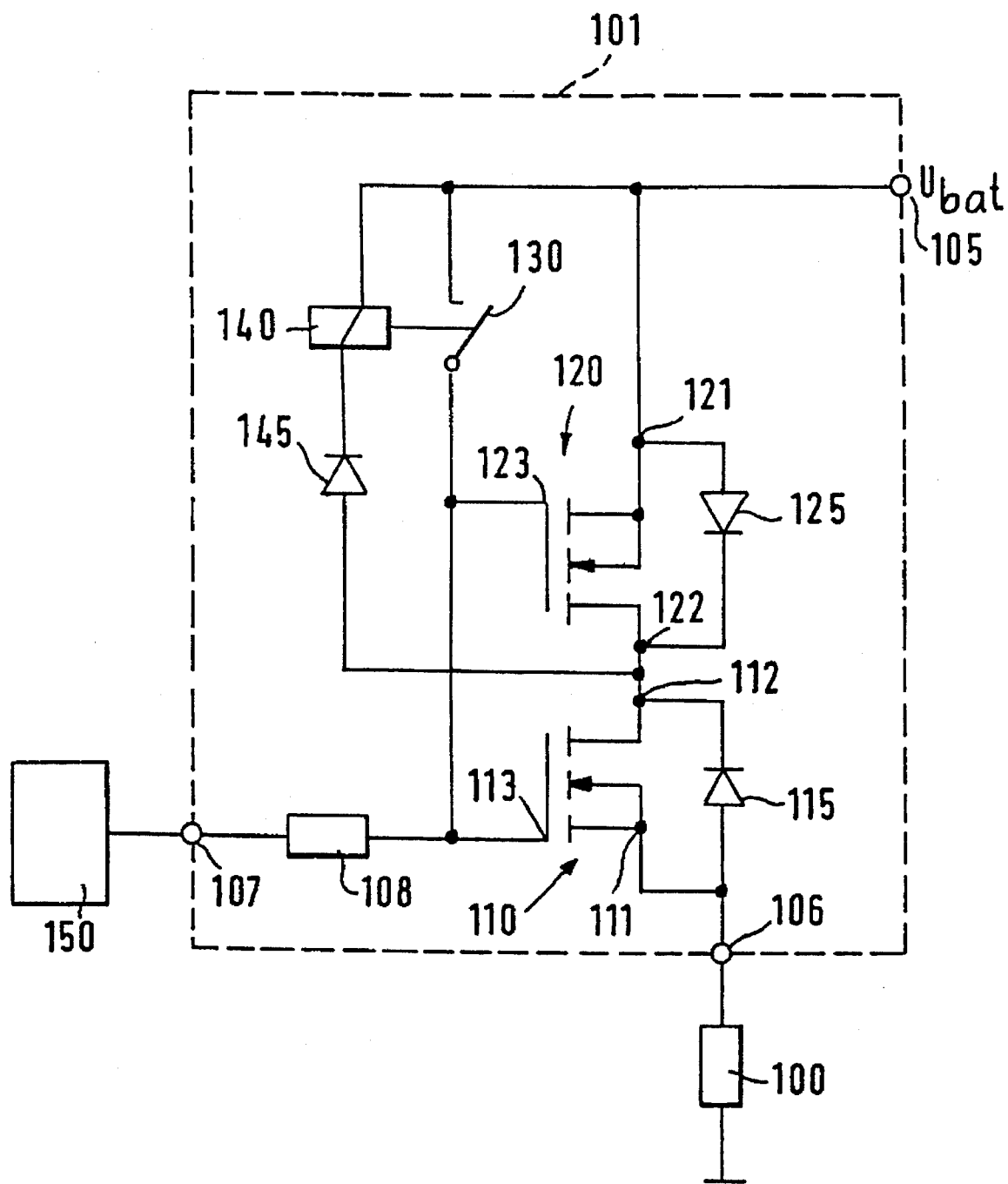
FIG. 1 shows a first embodiment of the switching device according to the present invention with a relay.

A first embodiment of the switching device 101 according to the present invention is represented in FIG. 1. The switching device 101 is connected by means of a first connection 105 to a supply voltage UBat. By means of a second connection 106, it is connected to earth (ground) via a consumer 100. A control unit 150 applies a drive signal to the switching device via a control connection 107.

The consumer 100 can be an arbitrary electric consumer. These are electromagnetic valves, motors or incandescent bulbs, for example.

The control unit 150 is, for example, a microprocessor or an output stage which, depending on different signals, provides a drive signal to be applied to the switching device 101. Depending on the occurrence of the drive signal, the switching device 101 releases the flow of current from the supply voltage UBat (connection 105) through the consumer 100 to earth.

The switching device 101 comprises a first field effect transistor 110, which is in contact by means of its source terminal 111 with the second connection 106 of the switching device 101. The gate terminal 113 of the field effect transistor 110 is connected to the control terminal 107. The parasitic substrate diode of the field effect transistor 110 is denoted by 115.

The drain terminal 112 of the first field effect transistor 110 is directly connected to the drain terminal 122 of a second field effect transistor 120. The source terminal 121 of the second field effect transistor 120 is connected to the first connection 105 of the switching device 101. The gate terminal 123 of the second field effect transistor 120 is likewise connected to the control connection 107.

Owing to the fact that the drain terminals are connected directly to one another and that the second field effect transistor 120 is connected and operated inversely relative to the first field effect transistor 110, the parasitic diodes 115 and 125 are connected in opposite directions. The consequence of this is that, in the case of polarity reversal, no current flows via the series connection of these diodes, in so far as the field effect transistor 120 is blocked.

Furthermore, a coil 140 of a relay and a diode 145 are connected between the first connection 105 and the drain terminals 112 and 122 of the two field effect transistors. The cathode of the diode 145 is connected in this arrangement to the coil 140 and the anode is connected to the drain terminals. This relay coil actuates a switch 130, which establishes a connection between the first connection 105 and the gate terminals 123, 113, of the two field effect transistors 110 and 120.

The correct polarity of the switching device 101 is represented in FIG. 1. In the case of correct polarity, the supply voltage assumes a positive potential with respect to the earth connection. In this case, the two field effect transistors can be turned on by applying a drive signal of their gate terminal 113 and their gate terminal 123, and thus the flow of current can be released from the connection 105 via the connection 106 to the consumer 100.

In the normal mode of operation, that is to say given correct polarity, the diode 145 prevents the flow of current through the coil 140 and the switch 130 is open. They do not exert any sort of influence.

If, in contrast, the switching device 101 and the load are installed with polarity jointly reversed, that is to say the first connection 105 is connected to earth and the consumer 100 or the second connection 106 is connected to the supply voltage UBat, a current flows to earth through the coil 140 of the relay via the parasitic substrate diode 115 of the first field effect transistor 110. This has the effect that the switch 130 closes and the gate terminals 123 and 113 of the two field effect transistors 110 and 120 are connected to earth. This means that the field effect transistor 120 and its parasitic diode 125 block the flow of current. In this case, the resistance of the coil is to be dimensioned in such a way that the current which flows via the coil 140, the diode 115 and through the consumer 100 does not lead to a reaction of the consumer 100. In the example of a solenoid valve coil, this means that the resistances and thus the current are selected such that the armature of the solenoid valve does not move.

Figure 2:
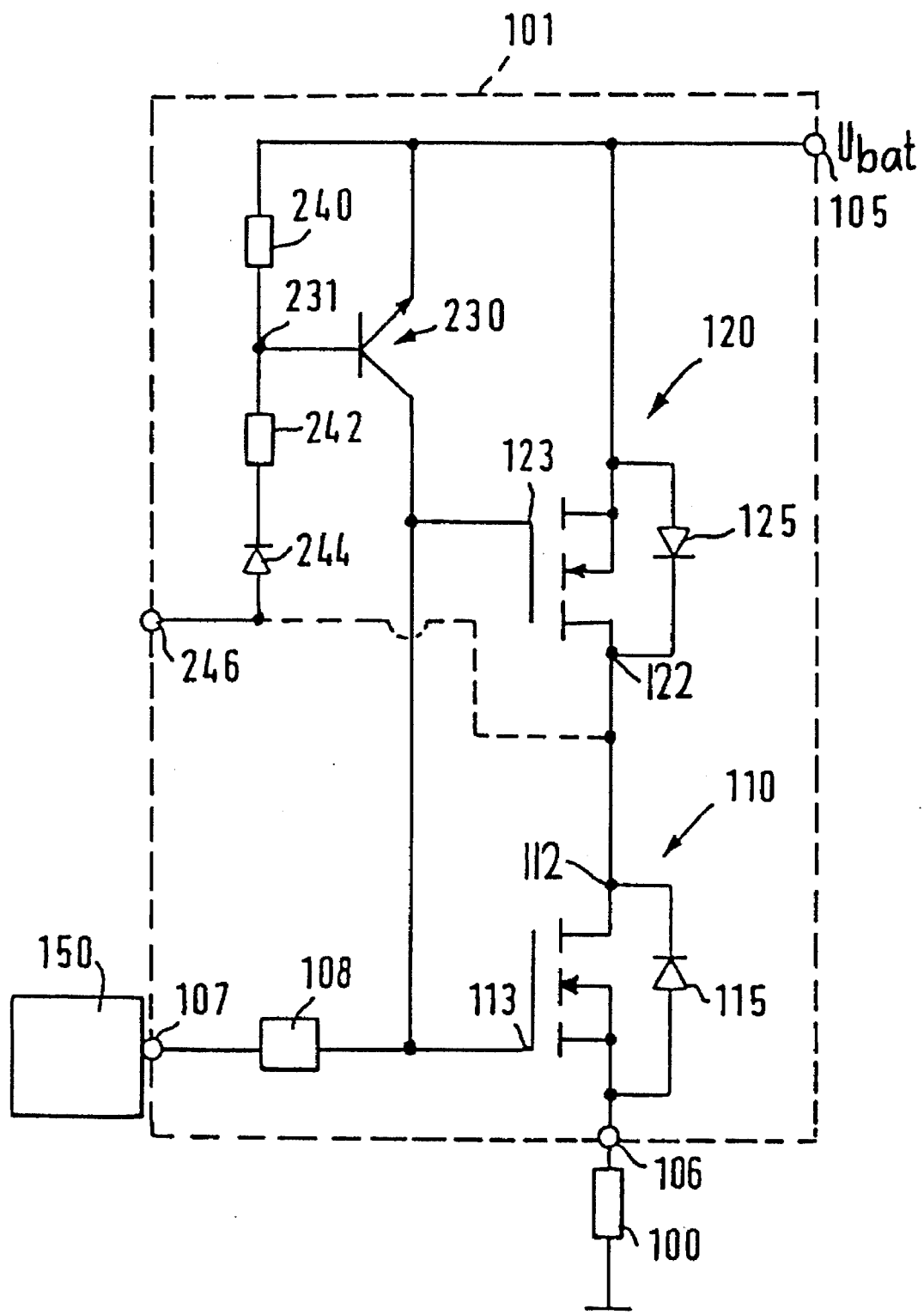
FIG. 2 shows a second embodiment of the switching device according to the present invention with a bipolar transistor.

A second embodiment is represented in FIG. 2. In addition to the elements already described in FIG. 1, which are provided with the same reference numerals, in this embodiment the relay coil 140 and the switch 130 are eliminated.

The control connection 107 is connected via a preferably ohmic resistor 108 to the gate terminals 113 and 123 as well as, via a transistor 230, to the first connection 105. The base terminal 231 of the transistor 230 is in contact with the center tap of a voltage divider including a series connection of a resistor 240, a resistor 242 and a diode 244. The resistor 242 is connected with its second connection to the cathode of the diode 244. The anode of the diode 244 is connected to a further connection 246 of the switching device 101. This connection 246 is an additional earth connection.

Given the correct polarity of the switch, there is formed at the voltage divider including the resistors 242 and 240 a voltage which has the effect that the transistor 230 remains in its nonconductive state. This, in turn, has the effect that the signal which is present at the control connection 107 is applied to the field effect transistors 110 and 120.

In the case of a wrong polarity, that is to say that the connection 105 is at earth potential, the base of the transistor 230 is at earth. The effect of this is that the transistor 230 applies the earth potential present at the connection 105 to the gate terminals of the field effect transistors 110 and 120. As a result of this, the field effect transistor 120 and its parasitic diode 125 block the flow of current through the consumer 100.

In the case of polarity-reversed connections 105 and 106, the parasitic substrate diode 115 of the field effect transistor 110 is conductive. The parasitic diode 125 of the field effect transistor 120 blocks in the case of polarity reversal, assuming that the field effect transistor 120 is itself nonconductive. The transistor 230 ensures that blocking of the field effect transistor 120 by virtue of the fact that via the voltage divider including the resistors 240, 242 and the diode 244 it is driven in such a way that the gate terminal 123 of the field effect transistor 120 is at source potential.

A particularly advantageous configuration of this embodiment is drawn in with dashes. In this configuration, the anode of the diode 244 is connected to the drain terminals 122 and 112 of the transistors 120 and 110. Consequently, the further external connection to earth can be avoided. The method of functioning corresponds to the method of functioning of the embodiment represented in FIG. 1.

Figure 3:
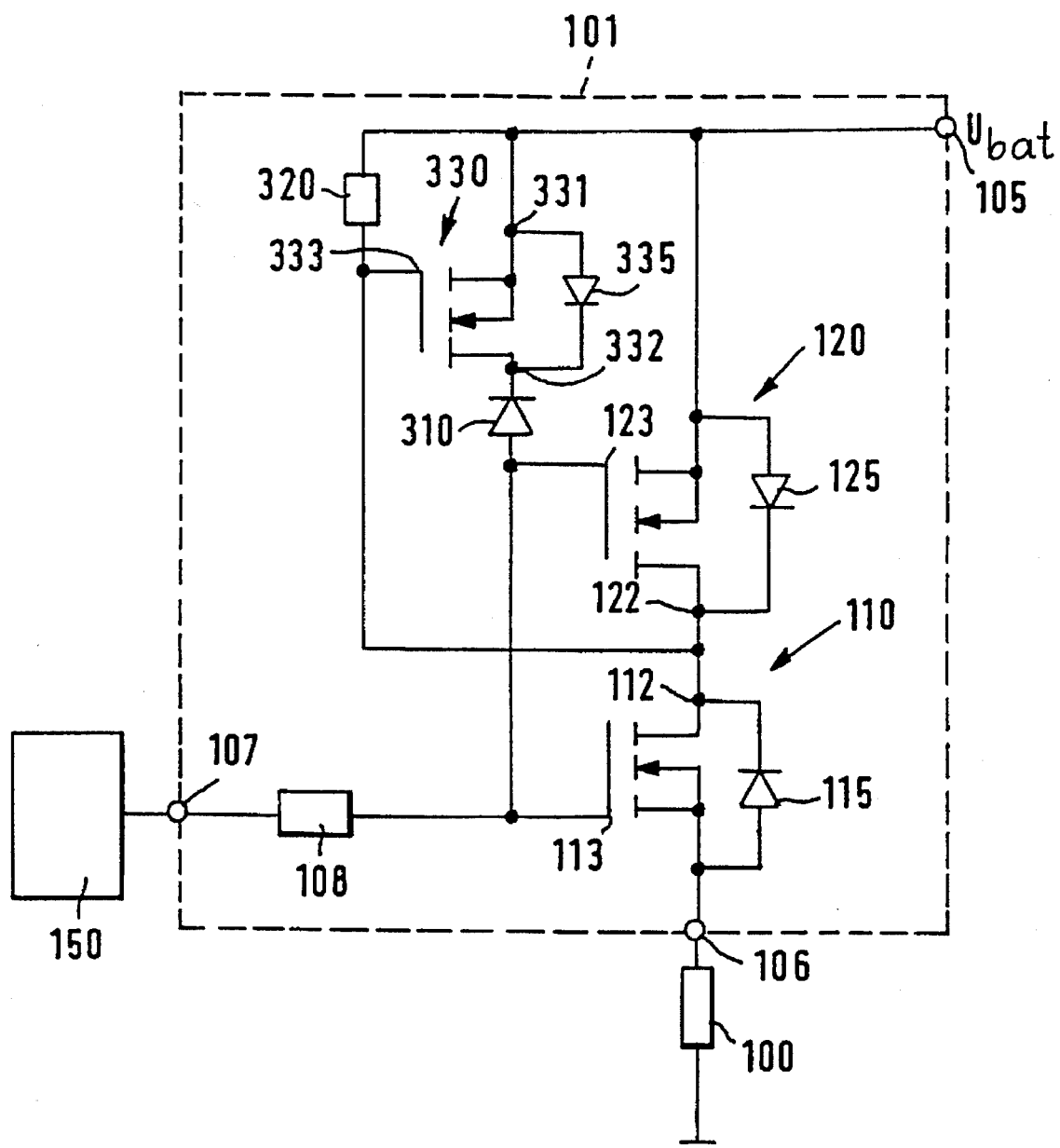
FIG. 3 shows a third embodiment of the switching device according to the present invention with a field effect transistor.

FIG. 3 shows a further embodiment, in which the transistor 230 is replaced by a field effect transistor 330. Furthermore, connected between the drain terminal 332 of the field effect transistor 330 is the cathode of a diode 310, which is connected to the gate terminals 123 and 113 of the field effect transistors 110 and 120. Furthermore, the parasitic substrate diode 335 of the field effect transistor 330 is drawn in.

The source terminal 331 of the field effect transistor 330 is connected to the first connection 105 of the switching device 101 and to a resistor 320. The second connection of the resistor 320 is in contact with the gate terminal 333 of the field effect transistor 330 and with the connection point of the drain terminals 122 and 112.

Given correct polarity, the field effect transistor 330 is in its nonconductive state, since the gate terminal 333 is connected to earth potential via transistor 110 and load 100.

In the case of polarity reversal, a current flows from the connection 106, which is at battery voltage, via the parasitic substrate diode 115 of the field effect transistor 110 and the resistor 320, to the first connection 105, which is at earth potential. The voltage drop across the resistor 320 and across the resistance of the consumer 100 has the effect that there is present at the gate terminal 333 a potential which is positive with respect to the source terminal 331, as a result of which the field effect transistor 330 goes over to its conductive state. Given the conductive field effect transistor 330, the gate terminal 123 and the gate terminal 113 of the field effect transistors 120 and 110 are connected to earth potential via diode 310 and transistor 330. Consequently, the transistor 120 and its parasitic diode 125 have a blocking effect, as a result of which the load is protected.

Reliable blocking of the polarity reversal protection transistor 120 is guaranteed by means of the field effect transistor 330. The diode 310 prevents undesired driving of the transistors 120 and 110 in normal operation. A current can be prevented from flowing via the load 100 in the case of polarity reversal by means of this arrangement.

This embodiment is particularly advantageous, since, just like the embodiment in accordance with FIG. 1, this embodiment does not require a separate earth connection. Particularly advantageous in the case of the embodiment in accordance with FIG. 3 is that the entire polarity reversal protection arrangement can be integrated in common with the field effect transistors normally used in a three-pole housing. There is therefore no need for an additional connection because of the polarity reversal protection. Furthermore, the polarity reversal protection system can be produced in the same work operation as the usual field effect transistor.

In the embodiments represented, the field effect transistors are realized as N-channel MOS field effect transistors. The arrangement according to the present invention can, however, also be realized using other semiconductor switching elements. In this case, the terminals are to be appropriately interchanged. If, for example, p-channel MOS field effect transistors are used, the drain terminals and the source terminals are to be interchanged. A corresponding statement holds in the case of negative supply voltages.

What is claimed is:
1. A switching device comprising:
   a first connection;
   a second connection;
   a first transistor connected to the second connection;
   a second transistor connected in series between the first connection and the first transistor;
   a control connection for receiving a control signal, at least one of the first and second transistors being controlled as a function of the control signal, wherein the second transistor is operated inversely with respect to the first transistor, wherein each of the first and second transistors has at least a first terminal, a second terminal, and a third terminal, wherein the first terminal of the first transistor is coupled to a load through the second connection, wherein the first terminal of the second transistor is coupled to a supply voltage through the first connection, wherein the second terminal of the first transistor is coupled to the second terminal of the second transistor through a common connection point, wherein the common connection point is coupled to the first connection through a resistance element; and
   a switching element having at least a first terminal and a second terminal, the first terminal of the switching element being coupled to the first connection, and the second terminal of the switching element being coupled to the third terminal of at least one of the first and second transistors, the switching element driving at least one of the first and second transistors as a function of a flow of current through the resistance element such that at least one of the first and second transistors interrupts the flow of current, in a case of polarity reversal.

2. The switching device according to claim 1, wherein the switching element includes a field effect transistor.

3. The switching device according to claim 1, wherein:

the first and second transistors are constructed as field effect transistors; and the second terminals of the first and second transistors are drain terminals of the field effect transistors.

4. The switching device according to claim 3, wherein:

the third terminal of each of the first and second field effect transistors comprises a gate terminal; and in the case of polarity reversal, the gate terminal of at least one of the field effect transistors is coupled to at least one of ground and the first terminal of the second transistor via the switching element.

* * * * *